US008895403B2

(12) United States Patent
Liang et al.

(10) Patent No.: US 8,895,403 B2
(45) Date of Patent: Nov. 25, 2014

(54) TRANSISTOR, METHOD FOR FABRICATING THE TRANSISTOR, AND SEMICONDUCTOR DEVICE COMPRISING THE TRANSISTOR

(75) Inventors: Qingqing Liang, Lagrangeville, NY (US); Huicai Zhong, San Jose, CA (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 163 days.

(21) Appl. No.: 13/698,276

(22) PCT Filed: Nov. 30, 2011

(86) PCT No.: PCT/CN2011/001998
§ 371 (c)(1),
(2), (4) Date: Nov. 15, 2012

(87) PCT Pub. No.: WO2013/063728
PCT Pub. Date: May 10, 2013

(65) Prior Publication Data
US 2013/0153913 A1   Jun. 20, 2013

(30) Foreign Application Priority Data
Oct. 31, 2011   (CN) .......................... 2011 1 0336801

(51) Int. Cl.
| | |
|---|---|
| H01L 21/00 | (2006.01) |
| H01L 21/02 | (2006.01) |
| H01L 27/088 | (2006.01) |
| H01L 21/8238 | (2006.01) |
| H01L 21/84 | (2006.01) |
| H01L 27/12 | (2006.01) |

(52) U.S. Cl.
CPC ........ *H01L 21/02107* (2013.01); *H01L 27/088* (2013.01); *H01L 21/823807* (2013.01); *H01L 21/823878* (2013.01); *H01L 21/84* (2013.01); *H01L 27/1203* (2013.01)
USPC ............................. 438/400; 438/278; 438/238

(58) Field of Classification Search
CPC ................. H01L 21/02107; H01L 21/823878; H01L 27/1203; H01L 21/823807; H01L 21/84; H01L 27/088
USPC .......................................... 438/400, 238, 278
See application file for complete search history.

(56) References Cited

U.S. PATENT DOCUMENTS

| | | | |
|---|---|---|---|
| 5,656,537 A | 8/1997 | Iwamatsu et al. .............. 438/402 |
| 6,514,811 B2 * | 2/2003 | Hodges et al. ................. 438/238 |

(Continued)

FOREIGN PATENT DOCUMENTS

| | | | | |
|---|---|---|---|---|
| JP | 60-095962 | 5/1985 | | |
| JP | 60095962 A | * 5/1985 | .............. H01L 27/08 |

(Continued)

OTHER PUBLICATIONS

Japanese PCT ISR, FPPH11130072, Aug. 16, 2012.

*Primary Examiner* — Laura Menz
(74) *Attorney, Agent, or Firm* — Martine Penilla Group, LLP

(57) ABSTRACT

A transistor, a method for fabricating a transistor, and a semiconductor device comprising the transistor are disclosed in the present invention. The method for fabricating a transistor may comprise: providing a substrate and forming a first insulating layer on the substrate; defining a first device area on the first insulating layer; forming a spacer surrounding the first device area on the first insulating layer; defining a second device area on the first insulating layer, wherein the second device area is isolated from the first device area by the spacer; and forming transistor structures in the first and second device area, respectively. The method for fabricating a transistor of the present invention greatly reduces the space required for isolation, significantly decreases the process complexity, and greatly reduces fabricating cost.

15 Claims, 6 Drawing Sheets

(56) References Cited

U.S. PATENT DOCUMENTS

| | | | |
|---|---|---|---|
| 6,734,527 B1 | 5/2004 | Xiang | 257/616 |
| 7,563,676 B2* | 7/2009 | Kim | 438/258 |
| 7,880,229 B2* | 2/2011 | Madhavan et al. | 257/347 |
| 8,293,606 B2* | 10/2012 | Madhavan et al. | 438/278 |
| 8,648,438 B2* | 2/2014 | Cai et al. | 257/529 |
| 2009/0101976 A1* | 4/2009 | Madhavan et al. | 257/347 |
| 2009/0250746 A1* | 10/2009 | Kim | 257/324 |
| 2010/0314686 A1 | 12/2010 | Hirano | 257/351 |
| 2011/0086484 A1* | 4/2011 | Madhavan et al. | 438/278 |
| 2011/0147881 A1* | 6/2011 | Fenouillet-Beranger et al. | 257/506 |
| 2013/0082348 A1* | 4/2013 | Cai et al. | 257/529 |
| 2013/0153913 A1* | 6/2013 | Liang et al. | 257/66 |
| 2014/0131802 A1* | 5/2014 | Cai et al. | 257/350 |

FOREIGN PATENT DOCUMENTS

| | | | |
|---|---|---|---|
| JP | 2010-161400 | 7/2010 | |
| JP | 2010161400 A | 7/2010 | H01L 21/8238 |

* cited by examiner

US 8,895,403 B2

TRANSISTOR, METHOD FOR FABRICATING THE TRANSISTOR, AND SEMICONDUCTOR DEVICE COMPRISING THE TRANSISTOR

CLAIM OF PRIORITY

This application is a Section 371 National Stage Application of International Application No. PCT/CN2011/001998, filed on Nov. 30, 2011, which claims priority to Chinese Application No. CN201110336801.1, filed on Oct. 31, 2011 entitled "Transistor, Method for Fabricating the Transistor, and Semiconductor Device Comprising the Transistor", the entire contents of which are incorporated herein by reference in their entirety.

FIELD OF THE INVENTION

The present invention relates to a transistor and method for fabricating the same. More particularly, the present invention relates to a CMOS transistor and a method for fabricating the same. The present invention further relates to a semiconductor device comprising the transistor.

BACKGROUND OF THE INVENTION

Transistor is an element commonly used in the current integrated circuit, and a CMOS (Complementary Metal-Oxide-Semiconductor) transistor is a complementary type of MOS transistor composed of a N channel transistor and a P channel transistor.

In order to address the short channel effect in a bulk silicon CMOS transistor, it has been proposed to apply Ultra thin SOI (Semiconductor on Insulator) in the future VLSI technology. However, an ultra thin SOI blanket wafer is expensive.

To avoid influences among transistors during operation, it is required to isolate transistors. The conventional isolation technology comprises STI (Shallow Trench Isolation), LOCOS (Local Oxidation of Silicon), SWAMI (Sidewall Masked Isolation), or the like. However, a relatively large area is required in the conventional technology to isolate the N channel transistor and P channel transistor and isolate the source, drain, and gate contacts of transistors. The fabricating cost is inevitably increased.

SUMMARY OF THE INVENTION

The drawbacks in the prior art are solved in the present invention.

According to an aspect of the present invention, it is provided a method for fabricating a transistor, which may comprise: providing a substrate and forming a first insulating layer on the substrate; defining a first device area on the first insulating layer; forming a spacer surrounding the first device area on the first insulating layer; defining a second device area on the first insulating layer, wherein the second device area is isolated from the first device area by the spacer; and forming transistor structures in the first and second device area, respectively. In the method for fabricating a transistor according to the present invention, the spacer and the second device area are formed in a self-alignment manner, thus reducing the area of the transistor.

In an embodiment of the present invention, the step of defining the first device area on the first insulating layer may comprise: sequentially depositing a first semiconductor layer and a first mask layer on the first insulating layer; and patterning the first semiconductor layer and the first mask layer to define the first device area.

In an embodiment of the present invention, the step of patterning the first semiconductor layer and the first mask layer may comprise: applying a photoresist layer onto the first mask layer; forming a patterned photoresist layer by photolithography; and etching away a portion of the first mask layer and a portion of the first semiconductor layer by using the patterned photoresist layer as a mask, to expose the surface of the first insulating layer.

In an embodiment of the present invention, the step of defining a second device area on the first insulating layer may comprise: depositing a second semiconductor layer to cover the exposed portion of the first insulating layer, the spacer, and the first mask layer; depositing a second mask layer to fill in a recess over the second semiconductor layer on the exposed portion of the first insulating layer; polishing the second mask layer and the second semiconductor layer to flush with the top of the spacer and the first mask layer; removing the second semiconductor layer on side surfaces of the spacer by using the first mask layer and the second mask layer as a mask; and removing the first mask layer and the second mask layer.

In an embodiment of the present invention, the step of polishing the second mask layer and the second semiconductor layer may comprise: polishing the second mask layer to flush with the top of the second semiconductor layer in the first device area; and polishing the second mask layer and the second semiconductor layer to flush with the top of the spacer and the first mask layer.

In an embodiment of the present invention, the polishing may comprise chemical mechanical polishing.

In an embodiment of the present invention, the step of forming transistor structures may comprise: forming gate stacks on the first semiconductor layer and the second semiconductor layer; and forming source/drain contact windows between the gate stacks in a self-alignment manner, wherein the source/drain contact windows are lower than the spacer.

In an embodiment of the present invention, the method may further comprise: annealing the first semiconductor layer and the second semiconductor layer by laser irradiation before forming the gate stacks.

In an embodiment of the present invention, the step of forming the gate stacks may comprise: forming a gate dielectric on the first semiconductor layer and the second semiconductor layer.

In an embodiment of the present invention, the step of forming the gate stacks may comprise: forming a high k dielectric on the first semiconductor layer and the second semiconductor layer; and forming metal gates on the high k dielectric.

In an embodiment of the present invention, the method may further comprise: forming gate spacers on sidewalls of the gate stacks.

In an embodiment of the present invention, the method may further comprise: before forming source/drain contact windows, siliciding the exposed portion of the first semiconductor layer and the second semiconductor layer to form source/drain contact areas.

In an embodiment of the present invention, the method may further comprise: forming CMOS transistors from the transistor structures formed in the first and second device areas.

In an embodiment of the present invention, the first semiconductor layer may comprise N type polycrystalline silicon, and the second semiconductor layer comprises P type polycrystalline silicon.

In an embodiment of the present invention, the first insulating layer may be formed by a material selected from a group consisting of silicon oxide, silicon nitride, and silicon oxynitride.

In an embodiment of the present invention, the spacer may be formed by a material selected from a group consisting of silicon oxide, silicon nitride, silicon oxynitride, silicon carbide, and silicon oxycarbide.

In an embodiment of the present invention, the gate spacer may be formed by a material selected from a group consisting of silicon oxide, silicon nitride, silicon oxynitride, silicon carbide, and silicon oxycarbide.

According to a second aspect of the present invention, it is provided a transistor which may comprise: a first insulating layer on a substrate; a first device area on the first insulating layer; a spacer formed on the first insulating layer and surrounding the first device area; a second device area on the first insulating layer, wherein the second device area is isolated from the first device area by the spacer; and transistor structures formed in the first and second device area, respectively. In the transistor according to the present invention, the spacer and the second device area are formed in a self-alignment manner, thus reducing the area of the transistor.

In an embodiment of the present invention, the transistor may comprise: a first semiconductor layer on the first insulating layer in the first device area; and a second semiconductor layer on the first insulating layer in the second device area.

In an embodiment of the present invention, the transistor structures respectively formed in the first and second device areas may comprise: gate stacks formed on the first semiconductor layer and the second semiconductor layer, respectively; and source/drain contact windows formed between the gate stacks in a self-alignment manner, wherein source/drain contact windows are lower than the spacer.

In an embodiment of the present invention, the gate stack may comprise gate dielectrics formed on the first semiconductor layer and the second semiconductor layer, respectively.

In an embodiment of the present invention, the gate stacks may comprise: a high k dielectric formed on the first semiconductor layer and the second semiconductor layer; and a metal gate formed on the high k dielectric.

In an embodiment of the present invention, the gate stacks may comprise gate spacers formed on sidewalls.

In an embodiment of the present invention, transistor structures formed in the first and second device area may form a CMOS transistor.

According to a third aspect of the present invention, it is provided a semiconductor device comprising at least one transistors as described above.

In the method of the present invention, an ultra thin CMOS transistor is formed by a completely self-alignment process. As compared with the conventional method, the method for fabricating a transistor of the present invention greatly reduces the space required for isolation, significantly decreases the process complexity, and greatly reduces fabricating cost.

BRIEF DESCRIPTION OF THE DRAWINGS

These and other aspects of the invention are apparent from and will be further elucidated, by way of example, with reference to the drawings, in which.

DETAILED DESCRIPTION OF EMBODIMENTS

Figure 1:
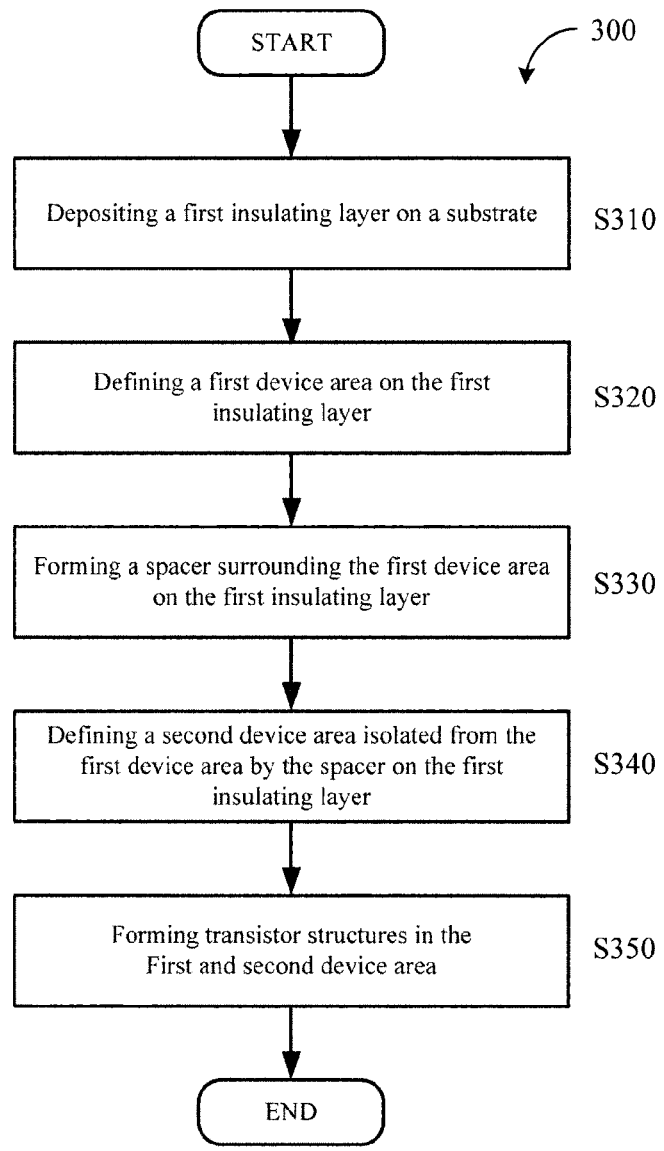
FIG. 1 is a flow chart showing a method for fabricating a transistor according to an embodiment of the present invention.

The exemplary embodiments of the present invention will be described in detail hereinafter with reference to accompanying drawings. The drawings are schematic and not drawn to scale. The drawings only serve to illustrate embodiments of the present invention, but not intend to limit the protection scope of the present invention. In the drawings, identical or similar components are indicated with the same reference numerals. In order to make the technical solution of the present invention more clear, the process steps and device structures well known in the art are omitted in this disclosure.

The first aspect of the present invention provides a method for fabricating a transistor. The method for fabricating a transistor according to the first aspect of the present invention will be described in detail hereinafter with reference to FIG. 1 and FIGS. 2-8B.

Figure 2:
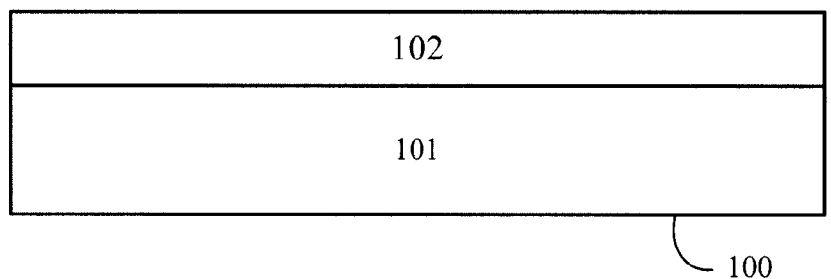
FIG. 2 is a schematically cross sectional view showing a step of the method for fabricating a transistor according to an embodiment of the present invention.

FIG. 2 shows the first step S310 of the method for fabricating a transistor 300 according to an exemplary embodiment of the present invention. In step S310, a substrate is provided and a first insulating layer is deposited on the substrate.

According to a preferred embodiment of the present invention, in step S310, a substrate 101 is provided. The substrate 101 may comprise any suitable substrate material (including insulator, semiconductor, conductor, or the like). In particular, the substrate may comprise, but not limited to, Si, Ge, SiGe, SiC, GaAs, InP, or any III/V group compound semiconductor. The substrate 101 may also be formed by other materials. For example, the substrate 101 may comprise, but not limited to, a material selected from a group consisting of sapphire, glass, organic materials, or any combination thereof.

By means of a process like atomic layer deposition (ALD), physical vapor deposition (PVD), chemical vapor deposition (CVD), a first insulating layer 102 is formed on the substrate 101. As an example, the first insulating layer 102 may comprise, but not limited to, one of the materials selected from a group consisting of silicon oxide, silicon nitride, and silicon oxynitride, or the combination thereof. The first insulating layer 102 has a thickness of 100~10000 Å, preferably 2000 Å.

Figure 3A:
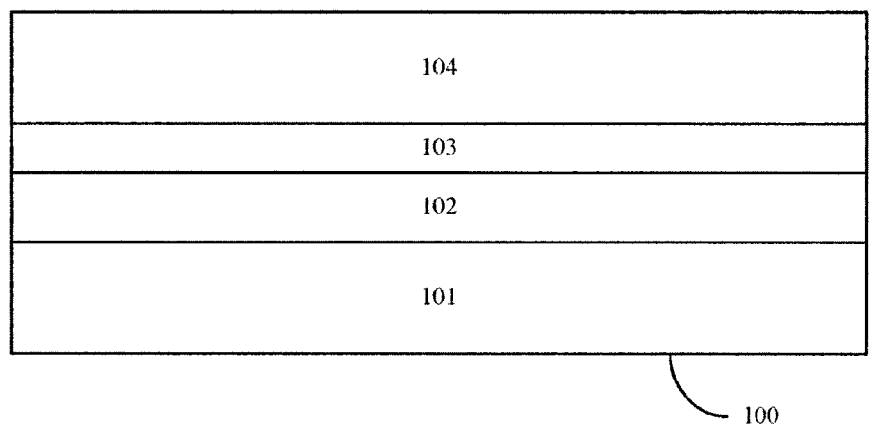
FIGS. 3A and 3B are schematically cross sectional views showing steps of the method for fabricating a transistor according to an embodiment of the present invention.
Figure 3B:
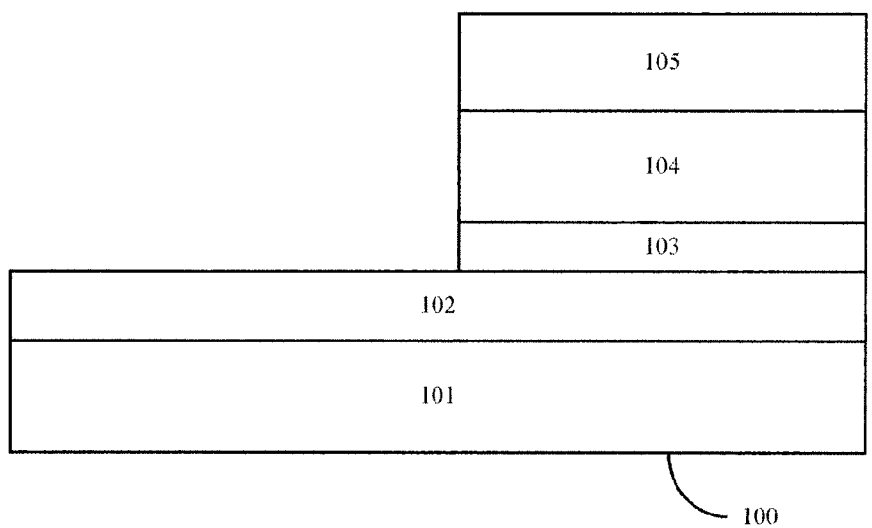

FIGS. 3A-3B shows the second step S320 of the method for fabricating the transistor 300 according to an exemplary embodiment of the present invention. In step S320, a first device area is defined.

As shown in FIG. 3A, a first semiconductor layer and a first mask layer are deposited sequentially on the first insulating layer. According to a preferred embodiment of the present invention, a first semiconductor layer 103 is formed on the first insulating layer 102. Preferably, the first semiconductor layer 103 has a thickness of 100~2000 Å, preferably 500 Å. As an example, the first semiconductor layer 103 may comprise polycrystalline silicon, but may also comprise any suitable semiconductor substrate material. For example, the first semiconductor layer 103 may comprise N type polycrystalline silicon.

A first mask layer 104 is formed on the first semiconductor layer 103 to act as a hard mask in the subsequent etching step. For example, silicon nitride, silicon oxide, silicon oxynitride, or tetraethyl orthosilicate (TEOS) is formed as the first mask layer 104 by a deposition process. Preferably, the first mask layer 104 may comprise silicon nitride, with a thickness of 100~10000 Å, preferably 1000~4000 Å.

As shown in FIG. 3B, the stack of the first semiconductor layer and the first mask layer is patterned to define a first device area. According to a preferred embodiment of the present invention, for example, a photoresist layer 105 with a thickness of about 1000~50000 Å is applied onto the first mask layer 104, and a patterned photoresist layer 105 is formed by a photolithography process. By using the patterned photoresist layer 105 as a mask, the exposed portion of the first mask layer 104 and the first semiconductor layer 103 is etched by for example a reactive ion etching (RIE) process.

For example, the exposed portion of the first mask layer 104 and the first semiconductor layer 103 is etched anisotropically, until the surface of the first insulating layer 102 is exposed, thus forming the first device area by patterning. In this embodiment, the first device area is a N type FET transistor (NFET) active area.

Figure 4:
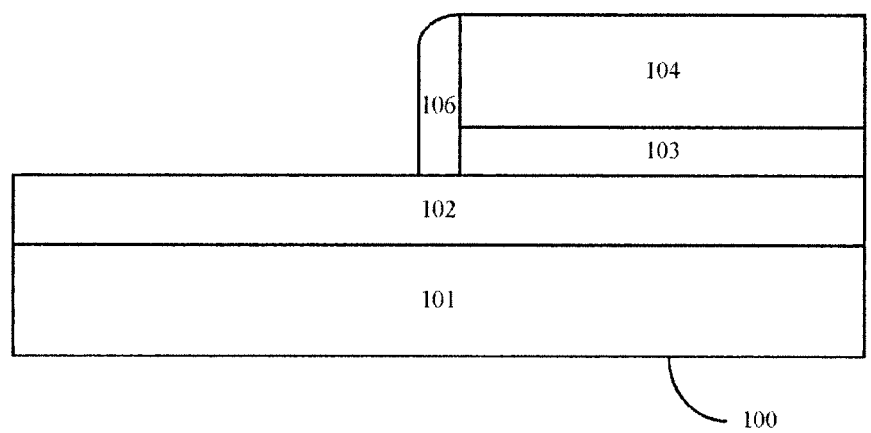
FIG. 4 is a schematically cross sectional view showing a step of the method for fabricating a transistor according to an embodiment of the present invention.

FIG. 4 shows the third step S330 of the method for fabricating the transistor 300 according to an exemplary embodiment of the present invention. In this step, a spacer is formed surrounding the first device area.

According to a preferred embodiment of the present invention, as shown in FIG. 4, a spacer 106 may be formed surrounding the sidewall of the NFET active area by conventional process steps. The spacer 106 may be formed by silicon oxide, silicon nitride, silicon oxynitride, silicon carbide, silicon oxycarbide, or the like. The height of the spacer 106 (i.e., the dimension in a direction perpendicular to the surface of substrate) is 100~10000 Å, preferably 100~4000 Å.

FIGS. 5A, 5B, 5C, and 5D shows the fourth step S340 of the method for fabricating the transistor 300 according to an exemplary embodiment of the present invention. In step S340, a second device area is defined.

Figure 5A:
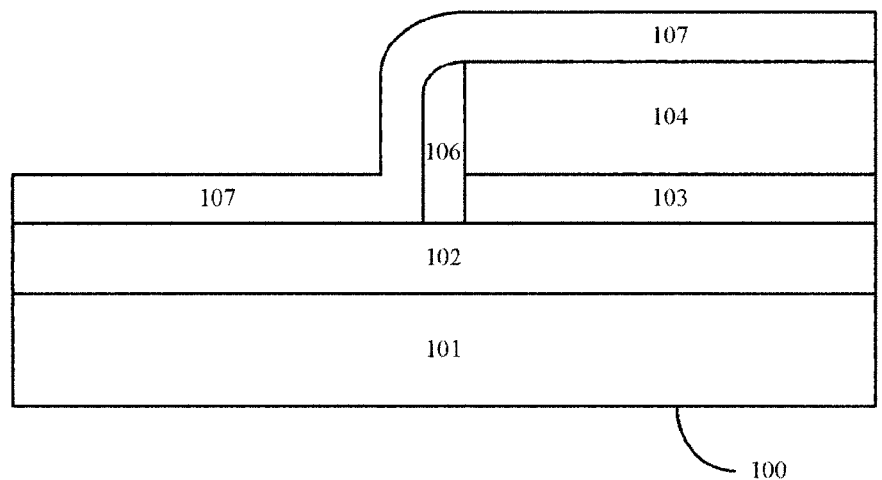
FIGS. 5A, 5B, 5C, and 5D are schematically cross sectional views showing steps of the method for fabricating a transistor according to an embodiment of the present invention.

As shown in FIG. 5A, a second semiconductor layer 107 is deposited isotropically on the exposed portion of the first insulating layer 102, the spacer 106, and the patterned first mask layer 104. The second semiconductor layer 107 has a thickness of 100~2000 Å, preferably 500 Å.

As an example, the second semiconductor layer 107 may comprise polycrystalline silicon, but may also comprise any suitable semiconductor substrate material. The conductivity type of the second semiconductor layer 107 is opposite to that of the first semiconductor layer 103. As an example, the second semiconductor layer 107 may comprise P type polycrystalline silicon.

Figure 5B:
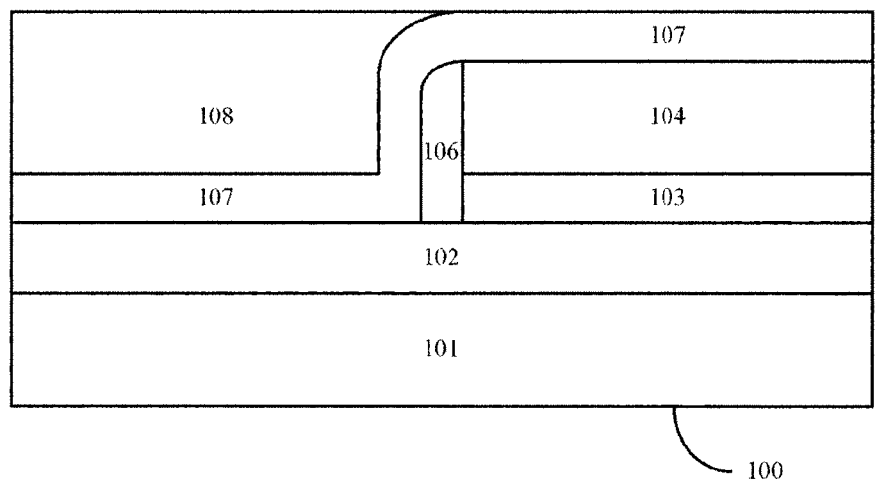

As shown in FIG. 5B, a second mask layer 108 is deposited to fill in a recess over the second semiconductor layer 107 which is deposited on the exposed portion of the first insulating layer 102. The second mask layer 108 is used as a hard mask in the subsequent etching step. Then, a planarizing process like e.g. chemical mechanical polishing (CMP) is performed to remove the excessive second mask layer 108 over the recess. The planarizing process stops at the top of the second semiconductor layer 107 in the NFET active area.

Preferably, the second mask layer 108 is formed by silicon nitride, silicon oxide, silicon oxynitride, or TEOS by means of a chemical vapor deposition process. In this embodiment, the second mask layer 108 may comprise silicon nitride.

Figure 5C:
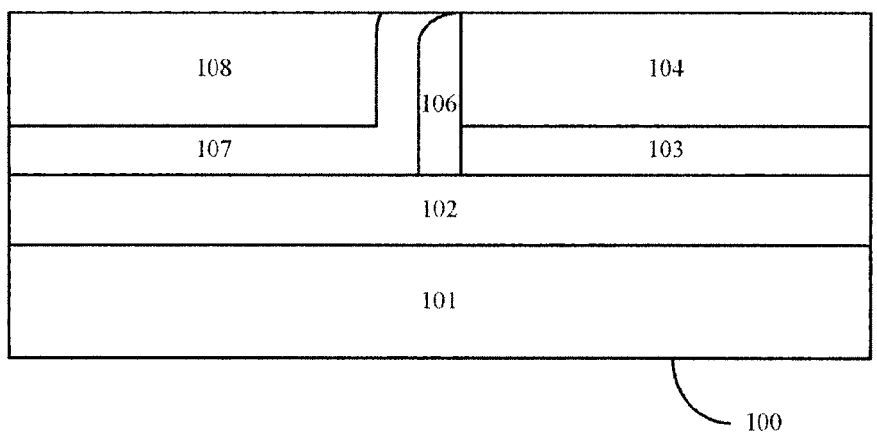

As shown in FIG. 5C, a planarizing process, e.g. a CMP process may be performed, which stops at the top of the spacer 106. In this manner, the second semiconductor layer 107 in the NFET active area removed, so that the top of the first mask layer 104, the spacer 106, and the second mask layer 108 is flush with each other.

As described above in conjunction with FIGS. 5B and 5C, a flat surface exposing the top of the spacer 106 is formed by performing two CMP process steps. By optimizing the etchant and the stop layer applied in these two CMP process steps, a better flatness of the resulting surface may be achieved.

Alternatively, the two CMP process steps shown in FIGS. 5B and 5C may be merged. That is, the second mask layer 108 and the second semiconductor layer 107 may be polished by a single CMP process step, so as to flush with the top of the spacer 106 and the first mask layer 104.

Figure 5D:
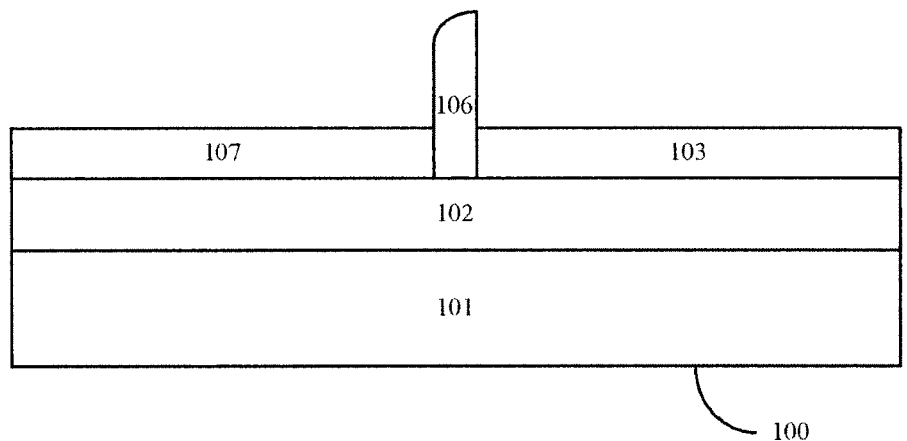

Then, by taking the first mask layer 104 and the second mask layer 108 in FIG. 5C as a hard mask, the second semiconductor layer 107 on the side surface of the spacer 106 is etched. The first mask layer 104 and the second mask layer 108 are removed by a wet or dry etching process, thus forming the second device area by patterning, as shown in FIG. 5D. In this embodiment, the second device area is an active area of the P type FET transistor (PFET).

The fifth step S350 of the method for fabricating the transistor 300 according to an exemplary embodiment of the present invention will be described in conjunction with FIGS. 6A-6B, 7A-7B, and 8A-8B. In step S350, a semiconductor device is formed in the first and second device area, respectively.

Figure 6A:
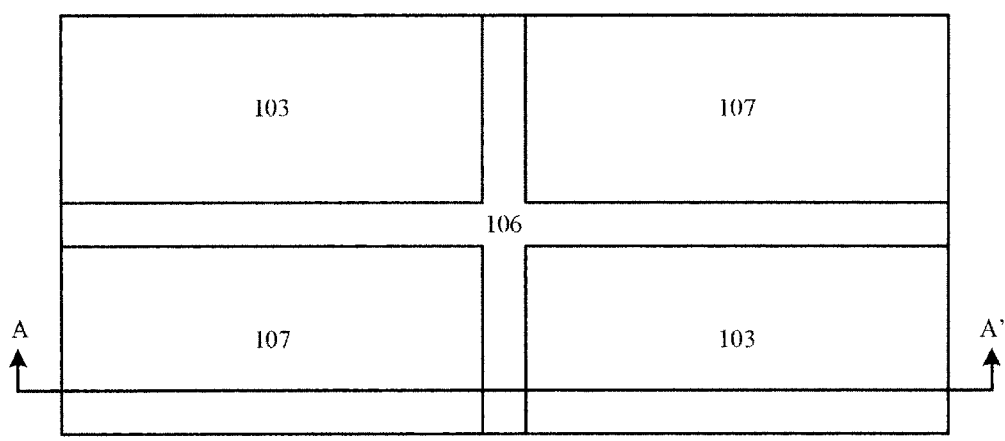
FIGS. 6A and 6B are schematically top view and cross sectional view, respectively, showing a step of the method for fabricating a transistor according to an embodiment of the present invention.
Figure 6B:
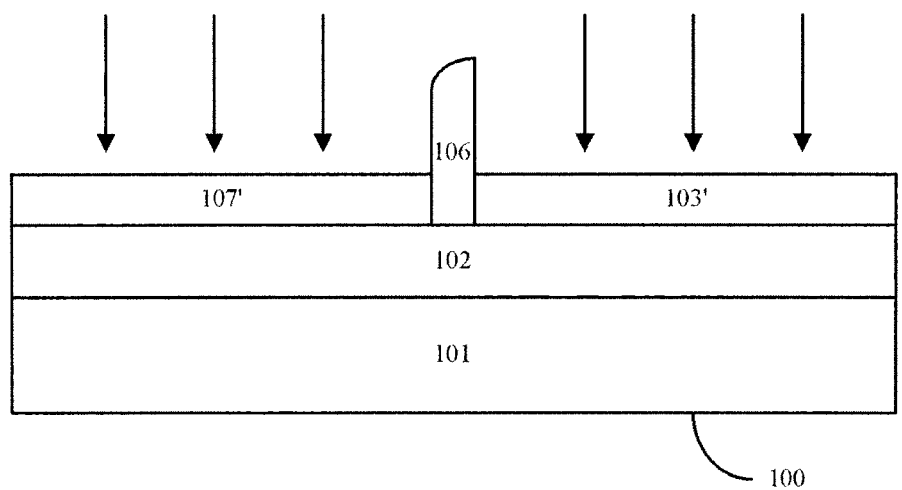

FIG. 6A shows in a top view the first sub-step S351 of a method for fabricating a transistor according to an exemplary embodiment of the present invention. FIG. 6B is a cross sectional view taken along the line A-A' in FIG. 6A. In the sub-step S351, optionally, the first semiconductor layer 103 and the second semiconductor layer 107 are subject to annealing.

As shown in FIG. 6A, the spacer 106 defines the first semiconductor area 103 and the second semiconductor area 107 of opposite conductivity types, and isolates these semiconductor areas from each other. In the exemplary embodiment, the spacer 106 defines two first semiconductor areas 103 and two second semiconductor areas 107, and each of the first semiconductor areas 103 is isolated from the second semiconductor area 107 by the spacer 106. It is noted that the manner in which the spacer 106 isolates the first and second semiconductor area as well as the number of the first and second semiconductor area may be determined according to requirements or specific applications.

As indicated by arrows in FIG. 6B, the first and second semiconductor area 103, 107 are subject to annealing by laser irradiation. The semiconductor areas recrystallise by the annealing to form recrystallised first and second semiconductor area 103', 107'. In the exemplary embodiment, the wavelength of the laser for example may lie in a range of 200 nm-600 nm. For example, the temperature for recrystallising semiconductor areas by laser irradiation is over 1200° C. However, the present invention is not limited to this. It is possible for the skilled in the art to select the laser wavelength and recrystallising temperature according to requirements and specific applications. By recrystallising the semiconductor areas, stress may be introduced or increased in the semiconductor areas so as to improve the performance of semiconductor device structures formed on the semiconductor areas. For example, in case that a NFET and a PFET are formed respectively on the semiconductor areas in the subsequent process steps, channels for transistors may be formed in these semiconductor areas, so that it is possible to increase the carrier mobility in channels and improve the speed of device.

Figure 7A:
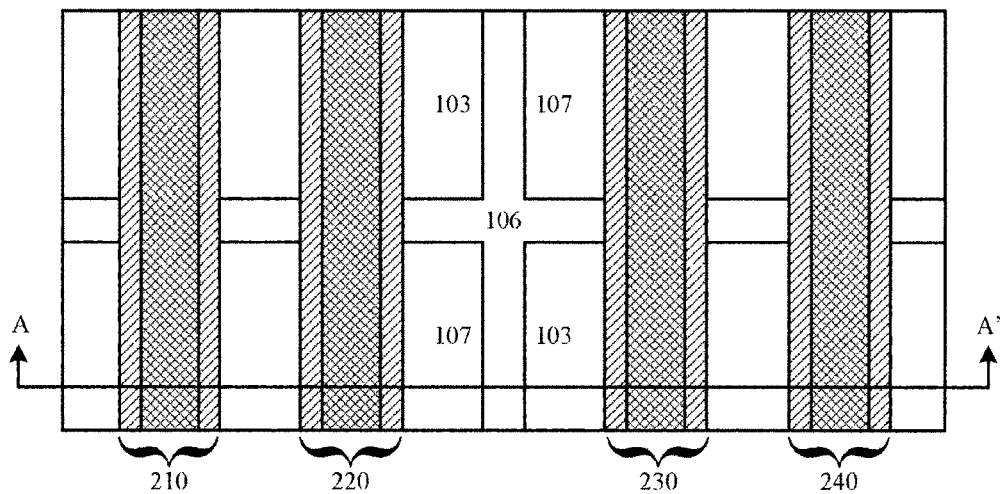
FIGS. 7A and 7B are schematically top view and cross sectional view, respectively, showing a step of the method for fabricating a transistor according to an embodiment of the present invention.
Figure 7B:
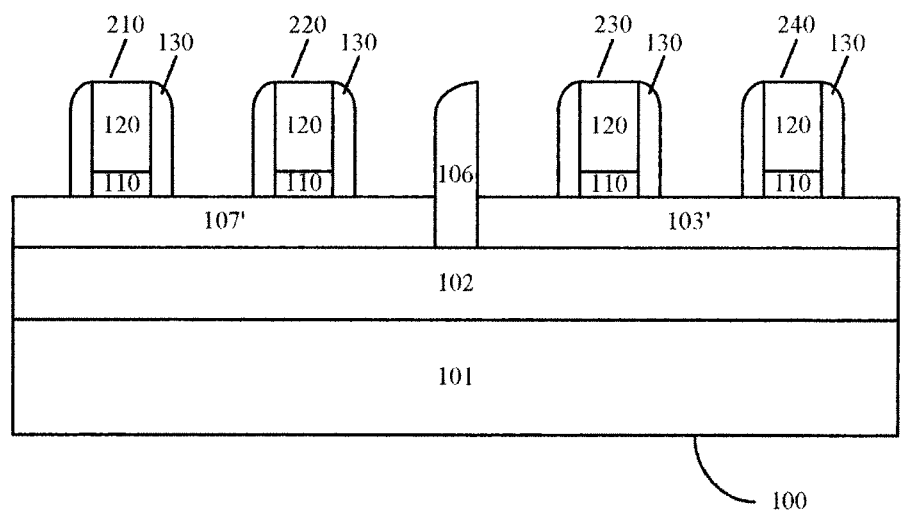

FIG. 7A shows in a top view the second sub-step S352 of the method for fabricating a transistor according to an exemplary embodiment of the present invention. FIG. 7B is a cross sectional view taken along the line A-A' in FIG. 7A. In the sub-step S352, the gate stacks 210, 220, 230, 240 are formed on the recrystallised first and second semiconductor area 103', 107'.

According to a preferred embodiment, the gate stacks 210-240 are formed on the semiconductor areas by the Gate First or Gate Last process. The gate stacks may comprise a gate dielectric 110 and a gate electrode 120 which are sequentially stacked.

In this embodiment, the gate dielectric 110 may comprise silicon oxide, silicon nitride, silicon oxynitride or combination thereof. In other embodiments, the gate dielectric 110 may be a high k dielectric, for example one of $HfO_2$, HfSiO, HfSiON, HfTaO, HfTiO, HfZrO, $Al_2O_3$, $La_2O_3$, $ZrO_2$, LaAlO, or combination thereof. The gate dielectric 110 may have a thickness of 2 nm-10 nm. Optionally, the gate stacks may not comprise the gate dielectric 110.

Optionally, a gate cover (not shown) may be formed on the top of each gate stack. The gate cover may comprise for example silicon nitride, silicon oxide, silicon oxynitride, or other dielectric materials with insulating characteristics.

The material for the gate electrode 120 may comprise polycrystalline silicon, polycrystalline Ge—Si, metal like Ti, Co, Ni, Al, Mo or W, or combination thereof, a metal nitride like TiN, or other conductive materials. In case that the gate dielectric 110 is formed by a high k dielectric, the gate electrode 120 is preferably formed by a metal material.

Optionally, a gate spacer 130 may be formed on sidewall of the gate stacks 210-240. The gate spacer 130 may be formed by silicon oxide, silicon nitride, silicon oxynitride, silicon carbide, silicon oxycarbide, or the like.

In the embodiment shown in FIGS. 7A and 7B, two gate stacks are formed in each active area. For example, the gate stacks 230, 240 are formed on the recrystallised first semiconductor area 103', and the gate stacks 210, 220 are formed on the recrystallised second semiconductor area 107'. However, it is noted that the present invention is not limited to this. It is possible for the skilled in the art to select the number of the gate stacks in each active area according to requirements and specific applications. For example, only one gate stack may be formed in each active area.

Figure 8A:
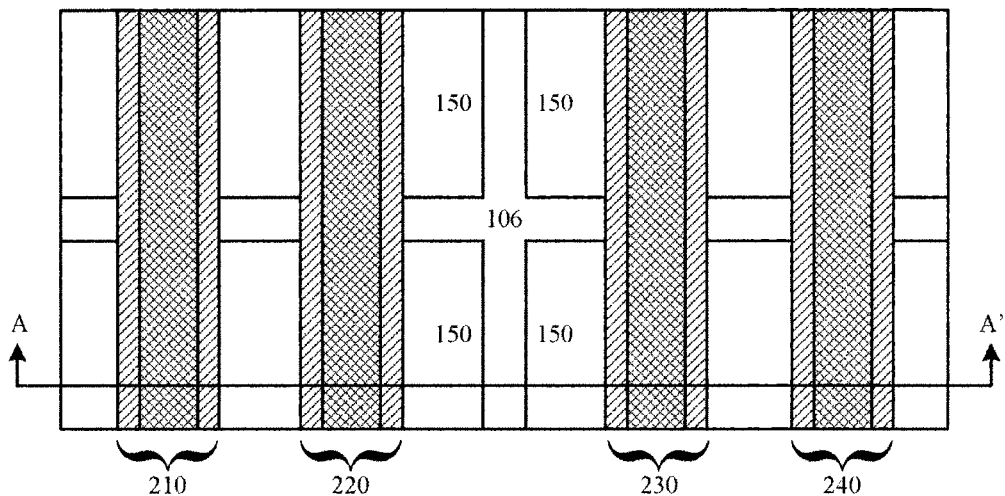
FIGS. 8A and 8B are schematically top view and cross sectional view, respectively, showing a step of the method for fabricating a transistor according to an embodiment of the present invention.
Figure 8B:
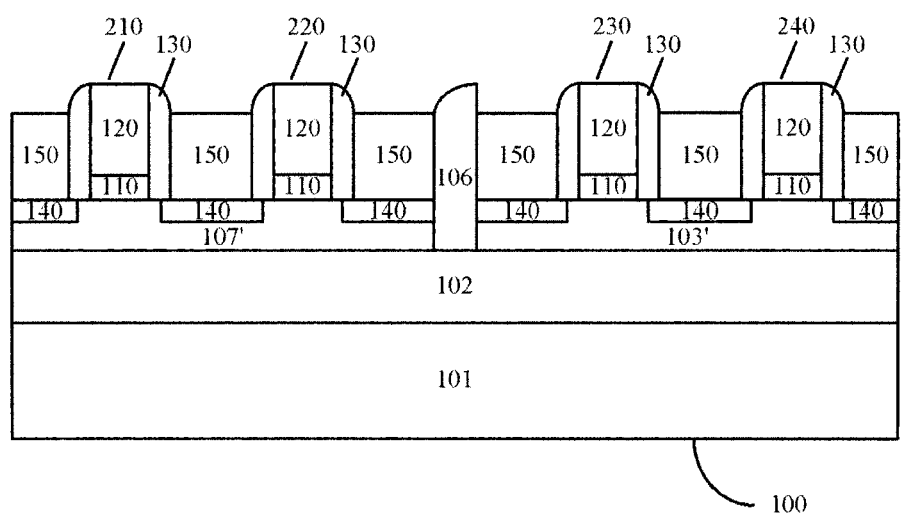

FIG. 8A shows in a top view the third sub-step S353 of the method for fabricating a transistor according to an exemplary embodiment of the present invention. FIG. 8B is a cross sectional view taken along line A-A' in FIG. 8A. In step S353, source/drain contact windows are formed.

According to a preferred embodiment, a conductive material is deposited by sputtering, evaporating, etc. to fill the space between the gate stacks 210-240 and the spacer 106. For example, the deposited conductive material is etched back by a wet etching process or the like, so as to form source/drain contact windows 150 on both sides of the gate stacks 210-240. Preferably, the source/drain contact windows 150 are lower than the gate stacks 210-240 and the spacer 106, so as to avoid undesired electrical interconnection between neighboring device areas or neighboring transistors. The conductive material may comprise a metal like W, Cu; a metal nitride like TaN, TiN; or other conductive materials.

Optionally, before forming the source/drain contact windows 150, by taking the gate stacks 210-240 and the spacer 106 as a mask, the exposed portion of the recrystallised first and second semiconductor area 103', 107' is silicided to form silicided source/drain contact areas 140 on both sides of the gate stacks 210-240. By forming the source/drain contact areas 140, it is possible to reduce the contact resistance in source/drain regions. Alternatively, it is possible to use other masks in the siliciding step.

With the above process steps, the transistor according to an exemplary embodiment of the present invention is completed. However, the necessary subsequent processes may be performed to fabricate a complete transistor 100. For example, various devices may be formed on basis of the transistor shown in FIGS. 8A-8B by subsequent processes for contact plug, protection layer, or the like. In a preferred embodiment, the transistors in the first and second device area form a CMOS transistor 100. These subsequent processes are well known for those skilled in the art and thus not repeated herein for simplicity.

While the method for fabricating a transistor of the present invention has been described in detail, a transistor according to the second aspect of the present invention will be described briefly hereinafter with reference to FIGS. 8A-8B.

According to the second aspect of the present invention, a transistor 100 may comprise: a first insulating layer 102 on a substrate 101; a first device area on the first insulating layer 102; a spacer 106 formed on the first insulating layer 102 and surrounding the first device area; a second device area on the first insulating layer 102, wherein the second device area is isolated from the first device area by the spacer 106; and transistor structures formed in the first and second device area, respectively.

Optionally, the transistor may comprise: a first semiconductor layer 103 on the first insulating layer 102 in the first device area; and a second semiconductor layer 107 on the first insulating layer 102 in the second device area.

Optionally, the transistor structure may comprise: gate stacks 210-240 formed on the first semiconductor layer 103 and the second semiconductor layer 107; and source/drain contact windows 150 formed between the gate stacks 210-240 in a self-alignment manner, wherein source/drain contact windows 150 are lower than the spacer 106.

Optionally, the gate stacks 210-240 may comprise a gate dielectric 110 formed on the first semiconductor layer 103 and the second semiconductor layer 107.

Optionally, the gate stacks 210-240 may comprise: a high k dielectric 110 formed on the first semiconductor layer 103 and the second semiconductor layer 107; and a metal gate 120 formed on the high k dielectric.

Optionally, the gate stacks 210-240 may comprise a gate spacer 130 formed on a sidewall.

Optionally, transistor structures formed in the first and second device area may form a CMOS transistor.

Optionally, the first semiconductor layer 103 may comprise N type polycrystalline silicon, and the second semiconductor layer 107 may comprise P type polycrystalline silicon.

Optionally, the first insulating layer 102 may be formed by a material selected from a group consisting of silicon oxide, silicon nitride, and silicon oxynitride.

Optionally, the spacer 106 may be formed by a material selected from a group consisting of silicon oxide, silicon nitride, silicon oxynitride, silicon carbide, and silicon oxycarbide.

Optionally, the gate spacer 130 may be formed by a material selected from a group consisting of silicon oxide, silicon nitride, silicon oxynitride, silicon carbide, and silicon oxycarbide.

In the third aspect of the present invention, it is further provided a semiconductor device comprising the transistor described in the above embodiments.

In the method for fabricating a transistor according to the present invention, an ultra thin CMOS transistor is formed by a completely self-alignment process. As compared with the conventional method, the method for fabricating a transistor of the present invention greatly reduces the space required for isolation, significantly decreases the process complexity, and greatly reduces fabricating cost.

It is noted that the present invention is disclosed in the above description by taking e.g., the fabrication of a MOSFET transistor as an example, it is apparent for the skilled in the art that in light of the spirit and principle of the present invention, the transistor and method for fabricating the same of the present invention is not limited to MOSFET, but also applicable to other types of transistor like Bipolar transistor, JFET transistor or the like, and other semiconductor devices. Therefore, the protection scope of the present invention also covers a semiconductor device and a method for fabricating the same, which comprises the transistor and steps of the method for fabricating the same as described above.

While the invention has been described in connection with preferred embodiments, it will be understood that modifications thereof within the principles outlined above will be evident to those skilled in the art, and thus the invention is not limited to the preferred embodiments but is intended to encompass such modifications. The invention resides in each and every novel characteristic feature and each and every combination of characteristic features. Reference numerals in the claims do not limit their protective scope. Use of the verb "to comprise" and its conjugations does not exclude the presence of elements other than those stated in the claims. Use of the article "a" or "an" preceding an element does not exclude the presence of a plurality of such elements. The mere fact that certain measures are recited in mutually different dependent claims does not indicate that a combination of these measures cannot be used to advantage.

What is claimed is:

1. A method for fabricating a transistor, comprising:
    providing a substrate and forming a first insulating layer on the substrate;
    defining a first device area on the first insulating layer;
    forming a spacer surrounding the first device area on the first insulating layer;
    defining a second device area on the first insulating layer, wherein the second device area is isolated from the first device area by the spacer; and
    forming transistor structures in the first and second device area, respectively;
    wherein the step of defining a first device area on the first insulating layer comprises:
    sequentially depositing a first semiconductor layer and a first mask layer on the first insulating layer;
    patterning the first semiconductor layer and the first mask layer to define the first device area;
    wherein the step of defining a second device area on the first insulating layer comprises:
    depositing a second semiconductor layer to cover the exposed portion of the first insulating layer, the spacer, and the first mask layer;
    depositing a second mask layer to fill in a recess over the second semiconductor layer on the exposed portion of the first insulating layer;
    polishing the second mask layer and the second semiconductor layer to flush with the top of the spacer and the first mask layer;
    removing the second semiconductor layer on side surfaces of the spacer by using the first mask layer and the second mask layer as a mask; and
    removing the first mask layer and the second mask layer.

2. The method according to claim 1, wherein the step of patterning the first semiconductor layer and the first mask layer comprises:
    applying a photoresist layer onto the first mask layer;
    forming a patterned photoresist layer by photolithography; and
    etching away a portion of the first mask layer and a portion of the first semiconductor layer by using the patterned photoresist layer as a mask, to expose the surface of the first insulating layer.

3. The method according to claim 1, wherein the step of polishing the second mask layer and the second semiconductor layer comprises:
    polishing the second mask layer to flush with the top of the second semiconductor layer in the first device area; and
    polishing the second mask layer and the second semiconductor layer to flush with the top of the spacer and the first mask layer.

4. The method according to claim 1, wherein the polishing comprises chemical mechanical polishing.

5. The method according to claim 1, wherein the step of forming transistor structures comprises:
    forming gate stacks on the first semiconductor layer and the second semiconductor layer; and
    forming source/drain contact windows between the gate stacks in a self-alignment manner, wherein the source/drain contact windows are lower than the spacer.

6. The method according to claim 5, further comprises:
    annealing the first semiconductor layer and the second semiconductor layer by laser irradiation before forming the gate stacks.

7. The method according to claim 5, wherein the step of forming the gate stack comprises:
    forming a gate dielectric on the first semiconductor layer and the second semiconductor layer.

8. The method according to claim 7, wherein forming the gate stacks comprises:
    forming a high k dielectric on the first semiconductor layer and the second semiconductor layer; and
    forming metal gates on the high k dielectric.

9. The method according to claim 5, further comprising:
    forming gate spacers on sidewalls of the gate stacks.

10. The method according to claim 5, further comprising:
    before forming source/drain contact windows, siliciding the exposed portion of the first semiconductor layer and the second semiconductor layer to form source/drain contact areas.

11. The method according to claim 1, further comprising:
    forming CMOS transistors from the transistor structures formed in the first and second device areas.

12. The method according to claim 1, wherein the first semiconductor layer comprises N type polycrystalline silicon, and the second semiconductor layer comprises P type polycrystalline silicon.

13. The method according to claim 1, wherein the first insulating layer is selected from a group consisting of silicon oxide, silicon nitride, and silicon oxynitride.

14. The method according to claim 1, wherein the spacer is selected from a group consisting of silicon oxide, silicon nitride, silicon oxynitride, silicon carbide, and silicon oxycarbide.

15. The method according to claim 9, wherein the gate spacer is formed by a material selected from a group consisting of silicon oxide, silicon nitride, silicon oxynitride, silicon carbide, and silicon oxycarbide.

\* \* \* \* \*